(12) United States Patent
Luechinger et al.

(10) Patent No.: US 6,471,110 B1
(45) Date of Patent: Oct. 29, 2002

(54) METHOD AND APPARATUS FOR MOUNTING SEMICONDUCTOR CHIPS

(75) Inventors: Christoph Luechinger, Irvine, CA (US); Markus Limacher, Horw (CH)

(73) Assignee: ESEC Trading SA, Cham (CH)

( * ) Notice: Subject to any disclaimer, the term of this patent is extended or adjusted under 35 U.S.C. 154(b) by 0 days.

(21) Appl. No.: 09/657,799

(22) Filed: Sep. 8, 2000

(30) Foreign Application Priority Data

Sep. 10, 1999 (CH) ................................. 1695/99

(51) Int. Cl.⁷ .......................... B23K 31/02; B23K 37/04
(52) U.S. Cl. ...................... 228/102; 228/8; 228/49.5; 228/180.21
(58) Field of Search ................................ 228/102, 103, 228/8, 9, 49.1, 49.5, 180.1, 180.21; 414/783, 935, 936, 941

(56) References Cited

U.S. PATENT DOCUMENTS

| | | | |
|---|---|---|---|
| 4,605,833 A | * | 8/1986 | Lindberg |
| 5,081,336 A | | 1/1992 | Schuster et al. ......... 219/85.16 |
| 5,222,648 A | * | 6/1993 | Takano |
| 5,673,844 A | * | 10/1997 | Sargent |
| 5,741,114 A | * | 4/1998 | Onodera |
| 5,878,939 A | | 3/1999 | Lüchinger et al. ............ 228/33 |
| 5,890,646 A | * | 4/1999 | Tang et al. |
| 5,971,250 A | * | 10/1999 | Safabakhsh et al. |
| 5,975,409 A | * | 11/1999 | Brofman et al. |
| 6,053,398 A | * | 4/2000 | Iizuka et al. |
| 6,170,736 B1 | * | 1/2001 | Briehl et al. |
| 6,250,538 B1 | * | 6/2001 | Grasmueller et al. |

FOREIGN PATENT DOCUMENTS

| | | | |
|---|---|---|---|
| JP | 402069952 A | * | 3/1990 |
| JP | 402094531 A | * | 4/1990 |
| JP | 404243144 A | * | 8/1992 |

* cited by examiner

Primary Examiner—Tom Dunn
Assistant Examiner—Kiley Stoner
(74) Attorney, Agent, or Firm—McCormick, Paulding & Huber LLP

(57) ABSTRACT

With the mounting of semiconductor chips on a substrate having a solder portion a semiconductor chip held by a gripper spring mounted on a bondhead is lowered onto the substrate. In doing so, the gripper is deflected towards the bondhead. Subsequently, the semiconductor chip is raised by a predetermined distance and then released. Optionally, the semiconductor chip is moved up and down before being released. With this method, the semiconductor chip is under mechanical control until the solder has taken up a stable form and the semiconductor chip has achieved its final position.

8 Claims, 3 Drawing Sheets

Figure 1A:
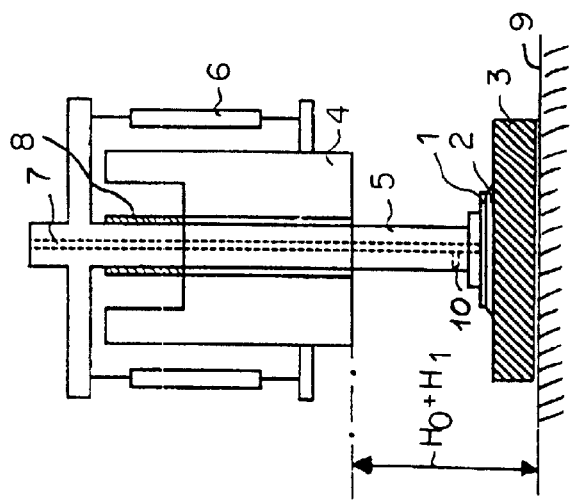

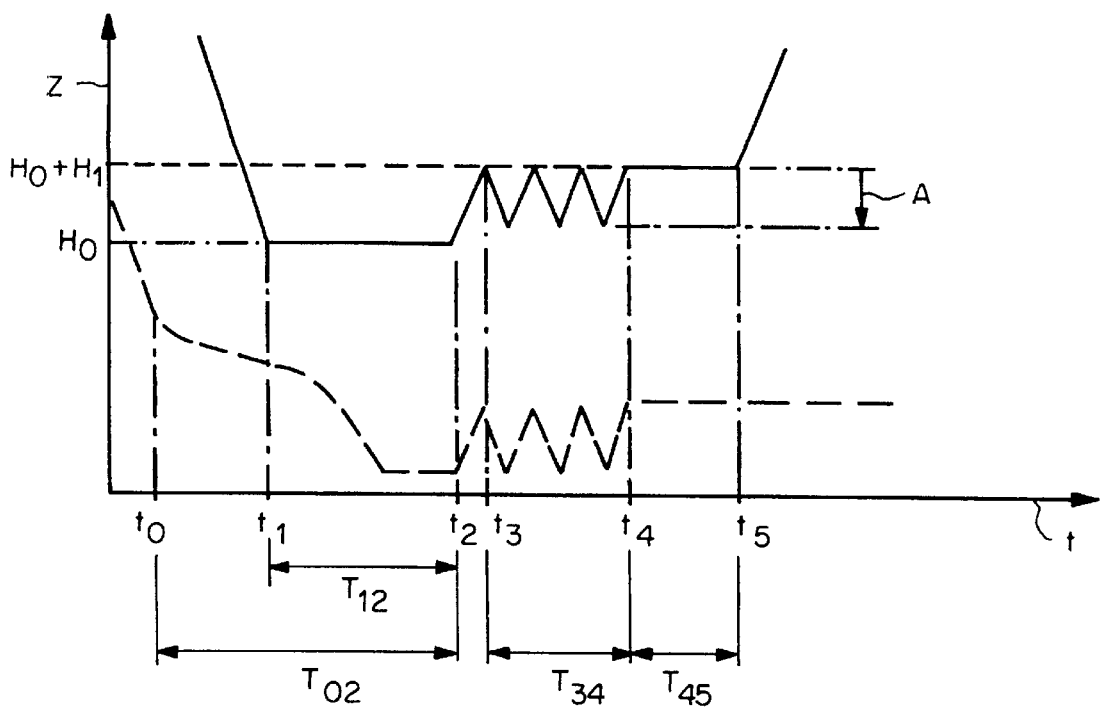
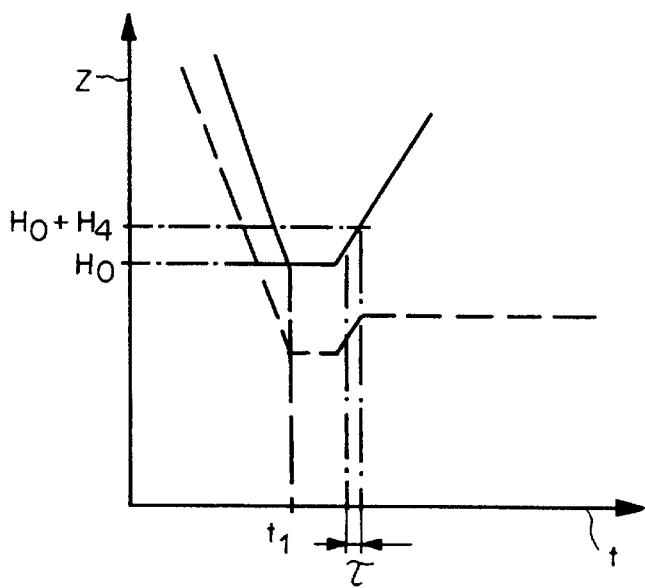

METHOD AND APPARATUS FOR MOUNTING SEMICONDUCTOR CHIPS

BACKGROUND OF THE INVENTION

The invention concerns a method for mounting semiconductor chips and an apparatus suitable for carrying out the method.

Soldering methods of this kind are typically—however not exclusively—used for the mounting of semiconductor chips on a metallic carrier, a so-called leadframe. Above all, power semiconductors are bonded to the substrate (normally copper) as a rule with soft solder in order to guarantee effective dissipation of the heat loss created in operation by the semiconductor chip by means of the solder connection.

An apparatus for the application of liquid solder to a substrate and for the subsequent mounting of a semiconductor chip onto the liquid solder portion is known from the U.S. Pat. No. 5,878,939. Under the name of "Die Bonder 2007 SSI" the applicant offers an apparatus of this kind whereby the semiconductor chip is placed over the solder portion on the substrate by means of a process known as "Overtravel". With this process, the bondhead is lowered so far that, on impact with the solder portion, the gripper holding the semiconductor chip is deflected towards the bondhead. In this way, variations in the thickness of the semiconductor chip, which typically amount to up to 40 $\mu$m, and variations in the height of the surface of the substrate can be overcome without problem.

The liquid soft solder has a very low viscosity and, on impact of the semiconductor chip, behaves like water, ie, it flows easily and almost instantly from underneath the semiconductor chip and spreads outside the semiconductor chip. Examinations with a high-speed camera have shown that in doing so a gap remains between the semiconductor chip and the substrate which is in fact filled with solder but the thickness of which only amounts to several micrometres. When the bondhead moves away, ideally a large part of the solder flows back into the gap between the semiconductor chip and the substrate, whereby the gap is again increased, the thickness of the solder layer however is subject to certain deviations even when the semiconductor chip is moved back and forth parallel to the surface of the substrate. Often, the solder does not flow back under the semiconductor chip but settles in beads next to the semiconductor chip. This results in very thin solder layers. In event that the solder flows back only partially or on one side, this results in solder layers with large tilt. The flowing back of the solder and the formation of a solder layer of sufficient thickness and homogeneity takes place uncontrolled. Increasingly higher demands are however now placed on the soldered connection: uniform thickness of the solder layer, distribution of the solder layer over the entire surface of the chip, completely bubblefree, high purity of the soldered connection.

The object of the invention is to further improve the quality of the soldered connection between the semiconductor chip and the substrate.

BRIEF DESCRIPTION OF THE INVENTION

The method in accordance with the invention for the mounting of semiconductor chips on a substrate having a solder portion is characterized by means of the following steps:

a) Presenting the substrate on a support;
b) Grasping the semiconductor chip by means of a gripper spring mounted on a bondhead;
c) Lowering of the semiconductor chip onto the substrate whereby the gripper carrying the semiconductor chip is deflected towards the bondhead;
d) Lifting the semiconductor chip by a predetermined distance;
e) Releasing the semiconductor chip;
f) Moving the bondhead away.

With step c, first of all the semiconductor chip impacts on the liquid solder whereby the solder portion is at first pressed flat as the result of the impact and then a large part of the solder is pressed out of the gap between the semiconductor chip and the substrate. The solder collects in beads to the side of the semiconductor chip. A gap filled with solder remains between the semiconductor chip and the substrate the thickness of which amounts to only a few micrometres, typically only around 5 micrometres. The aim is that with this step c, the entire back of the semiconductor chip including the corners is wetted with solder and that the solder gathers as uniformly as possible on all four sides of the semiconductor chip. How and whether the wetting of the entire back of the semiconductor chip takes place is not only dependent on the impact speed of the semiconductor chip and the degree of parallelism of its back with the surface of the substrate but also on other factors such as for example the cleanliness of the back of the semiconductor chip and the area on the substrate to be wetted, the form and quality of the solder, etc.

With step d, the semiconductor chip is now, unlike prior art, brought to a predetermined height above the substrate under mechanical control of the gripper whereby solder flows back into the increasing gap between the semiconductor chip and the substrate. The flowing back of the solder takes place under controlled conditions, in particular under the controlled suction effect of the semiconductor chip guided by the gripper. In this way it is achieved that the gap is relatively homogenously filled with solder up to the corners of the semiconductor chip. The wetting is meanwhile concluded, ie, the solder has formed meniscuses and has therefore achieved a stable state. The mechanical connection between the semiconductor chip and the gripper can now be released and the bondhead can be moved away without the position and/or tilt of the semiconductor chip being altered.

It is possible that bubbles, so-called voids, are contained within the solder. By means of a controlled up and down movement of the semiconductor chip after step d, it can if necessary be achieved that possible large bubbles break up into several small bubbles and that the bubbles migrate towards the edge of the semiconductor chip whereby bubbles arriving at the edge disappear. The reduction or even complete elimination of the bubbles, which itself is a characteristic of quality, also has the effect that the position of the semiconductor chip alters less strongly or not at all when releasing from the gripper, ie, improved tilt and therefore a higher value of the thinnest part of the solder layer or a more uniform thickness of the solder layer. As long as larger bubbles exist, there is the danger that the semiconductor chip sinks locally and ends up in a slanted position in relation to the surface of the substrate.

A prerequisite for achieving the required quality of the solder layer is of course that the bondhead is adjusted so that the underneath of the semiconductor chip is parallel to the surface of the substrate.

In the following, embodiments of the invention are explained in more detail based on the drawing.

Figure 1B:
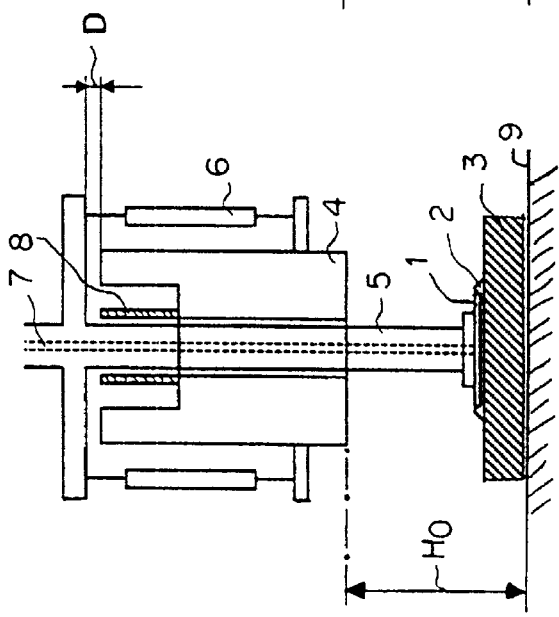
Figure 1C:
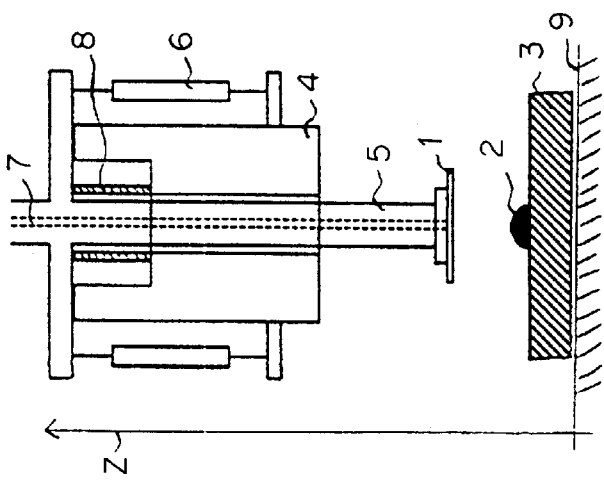
Figure 2:
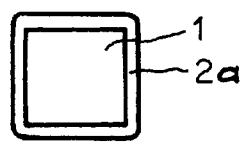
Figure 4:
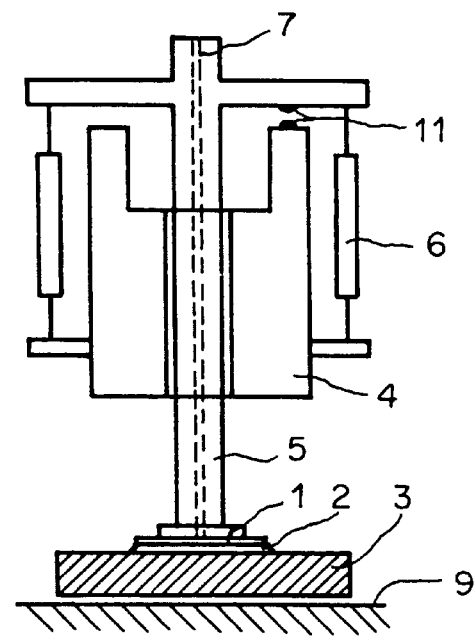
Figure 5A:
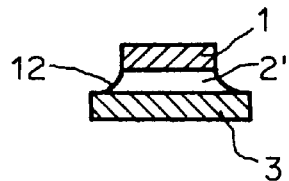

BRIEF DESCRIPTION OF THE DRAWING FIGURES is It is shown in:

FIGS. 1A–1C a first embodiment of an apparatus suitable for carrying out the method in accordance with the invention in various stages of the method, FIG. 2 a semiconductor chip with a soldered seam running round it,

FIG. 3 a diagram,

FIG. 4 a second embodiment of an apparatus suitable for carrying out the method in accordance with the invention, FIGS. 5A, B mounted semiconductor chips, and FIG. 6 a second diagram.

DETAILED DESCRIPTION OF THE INVENTION

FIGS. 1A to 1C show a first embodiment of an apparatus suitable for carrying out this method in various stages of the method. The semiconductor chip to be mounted is identified by the reference 1, the solder with 2 and the substrate with 3. The apparatus has a bondhead 4 movable in vertical z direction with a gripper 5 for the semiconductor chip 1. The gripper 5 is spring mounted on the bondhead 4 by means of two pretensioned draw springs 6 and can therefore be deflected from the resting position presented in FIG. 1A in vertical z direction in relation to the bondhead 4 against a force exerted by the draw springs 6. The gripper 5 has a drill hole 7, so that the semiconductor chip 1 can be held by means of applying vacuum to the drill hole 7. Two clamp jaws 8 movable in horizontal direction by means of a drive are arranged on the bondhead 4. The clamp jaws 8 can clamp the gripper 5 so that the gripper 5 then follows the movement of the bondhead 4. The substrate 3 is located on a support 9 of the apparatus.

FIG. 1A shows the apparatus before step c: The draw springs 6 pull the gripper 5 towards a stop surface of the bondhead 4, ie, the gripper 5 is in its resting position in relation to the bondhead 4. The clamp jaws 8 do not clamp the gripper 5.

FIG. 1B shows the apparatus after step c: The bondhead 4 is at height $H_0$ above the support 9, the gripper 5 is deflected by distance D towards the bondhead 4. The distance D varies as a result of the thickness variations of substrate 3 and semiconductor chip 1. The height $H_0$ is predetermined so that the distance D on average amounts to around 0.2 mm. Consequently, when lowering the bondhead 4, the semiconductor chip 1 firstly comes to rest on the solder 2 and with further lowering of the bondhead 4 to the final height $H_0$ the gripper 5 is deflected towards the bondhead 4. With this process, the greater part of the solder 2 flows out of the gap between the semiconductor chip 1 and the substrate 3 and collects in beads at the side of the semiconductor chip 1. A gap filled with solder remains between the semiconductor chip 1 and the substrate 3 the thickness of which amounts typically to only around 5 μm.

After the bondhead 4 has reached the height $H_0$ and the solder 2 has collected to the side of the semiconductor chip 1, the clamp jaws 8 are moved together so that they clamp the gripper 5 securely to the bondhead 4 in the deflected condition. With step d the bondhead 4 is raised by a predetermined distance $H_1$ with which the clamped gripper 5 and the semiconductor chip 1 are also raised by the distance $H_1$.

FIG. 1C shows the situation after step d. The bondhead 4 has been raised to the height $H_0 + H_1$ so far that the gap between the semiconductor chip 1 and the substrate 3 is approximately as large as the finally desired layer thickness of the solder 2. This layer thickness lies typically within the range of 20 to 100 μm. With this process, the solder 2 flows back into the gap. The semiconductor chip 1 securely held by the gripper 5 is located in a well-defined position. As soon as the flowing back of the solder 2 into the gap is completed or at least is almost completed, in step e, firstly the vacuum with which the semiconductor chip 1 is held by the gripper 5 is switched off and as soon as the semiconductor chip 1 is no longer or only very loosely held by the gripper 5, the bondhead 4 is moved away whereby the gripper 5 loosens itself from the semiconductor chip 1 and the mounting of the next semiconductor chip is initiated.

It has now been proved, that the tilt of the placed semiconductor chip 1 can be significantly improved when, after step d, the gripper 5 is additionally moved once or several times towards and away from the substrate 3 in z direction, ie, when the width of the gap between the semiconductor chip 1 and the substrate 3 is varied in a controlled manner by means of upward and downward movements of the bondhead 4 and the gripper 5. With this "pumping" it is achieved that, on the one hand, the solder 2 flows along the edges of the semiconductor chip 1 and a complete soldered seam 2a forms around the semiconductor chip 1 (see FIG. 2). On the other hand, any bubbles which may exist are diminished and transported to the edge of the semiconductor chip 1. Altogether this results in a complete, ie, bubble-free and uniform distribution of the solder 2 in the gap which manifests itself in less tilt and therefore an associated higher value of the thinnest part of the solder 2.

The upward and downward movement of the bondhead 4 can take place with the drive which drives the bondhead 4 in vertical direction. However, the upward and downward movement of the bondhead 4 is preferably brought about by means of an eccentric disc which acts directly on the bondhead 4. In order that the movements of the eccentric disc are perfectly transmitted to the bondhead 4, it is necessary that the bondhead 4 and the eccentric disc are continuously in contact. This is achieved in that the bondhead 4 is designed so that it comes into contact with the eccentric disc on moving to the bond position and ultimately presses against it with a slight initial tension in the bond position. In this way, oscillations of the bondhead 4 in z direction are at the same time effectively prevented.

FIG. 3 shows the course of the z-height of the semiconductor chip 1 (dashed line) and the bondhead 4 (unbroken line) above the support 9 as a function of time t. The bondhead 4 is firstly lowered as far as the predetermined height $H_0$ which it reaches at the point in time t, whereby the gripper 5 is deflected towards the bondhead 4 which is described as "overtravel". Before this, at point in time $t_0$, the semiconductor chip 1 already impacts on the solder 2. Afterwards, the bondhead 4 rests for a predetermined period of time $T_{12}$ up to point in time $t_2$. During the period of time $T_{02}$, a large part of the solder 2 which is located in the gap between the semiconductor chip 1 and the substrate 3 flows out of the gap and collects at the side of the semiconductor chip 1. This process generally takes place jerkily, ie, the semiconductor chip 1 firstly comes to rest on the hot solder 2, warms up and then sinks quickly because suddenly almost all the solder 2 flows out of the gap. Only now is the semiconductor chip 1 in a reproducible position largely independent of the original form of the solder 2, namely only a few micrometres above the substrate 3. As soon as this position has been reached, the gripper 5 is securely clamped by the clamp jaws 8 at point in time $t_2$ and the bondhead 4 is raised by the distance $H_1$. During the subsequent period of time $T_{34}$, the bondhead 4 is optionally moved upwards and downwards whereby the amplitude A of the up and down movement corresponds typically to around the distance $H_1$. The frequency of the up and down movement amounts typically to 50 Hz to 250 Hz, can however amount to up to 500 or 800 Hz. The number of up and down movements amounts to only 2 to 5 depending on the frequency or some 10s at higher frequencies. It is also possible to reduce the amplitude A with an increasing number of up and down movements. After conclusion of the up and down movements of the bondhead 4, the vacuum is released at point in time $t_4$ and finally, at point in time $t_5$, the bondhead 4 is moved away.

With this embodiment, steps c and d therefore take place as follows:

c) Lowering of the bondhead 4 to a predetermined height above the support 9, whereby the height is predetermined so that the gripper 5 holding the semiconductor chip 1 is deflected towards the bondhead 4, and d) Securing the gripper 5 to the bondhead 4 and raising the bondhead 4 by the predetermined distance $H_1$;

The chronological sequence of steps e and f can be planned on the one hand so that after releasing the vacuum at point in time $t_4$ a predetermined period of time $T_{45}$ is waited and the bondhead 4 is only moved away afterwards. The period of time $T_{45}$ must be measured so that the bondhead 4 loosens itself from the semiconductor chip 1 without problem when moving away. On the other hand, a sensor can be foreseen which measures the strength of the vacuum and the moving away of the bondhead 4 takes place at point in time $t_5$ as soon as the vacuum falls below a predetermined value.

An advantageous solution which enables the fast reduction of the vacuum at the tip of the gripper 5 comprises the provision of a drill hole 10 (FIG. 1C) above the tip of the gripper 5 which presents a controlled leak. The leak should be small enough so that, on applying vacuum, the gripper 5 can grasp and transport the semiconductor chip 1 and large enough so that the drill hole 7 at the tip of the gripper 5 immediately, ie within a few milliseconds, fills with the inert gas prevailing in the surroundings when the connection to the vacuum source is interrupted. It is then possible to release the vacuum immediately before the semiconductor chip has reached the height $H_0+H_1$ so that the mechanical guiding of the semiconductor chip 1 by means of the gripper 5 is terminated at around the height $H_0 +H_1$ and the bondhead 4 can move away without stopping (ie, $T_{45} =0$).

It has been proved that it can be advantageous to reduce the impact speed of the semiconductor chip 1 on the solder 2 so that the displaced solder 2 collects as close as possible to the semiconductor chip 1 and instead to move the semiconductor chip 1 at least once, preferably several times, upwards and downwards. The up and down movement of the semiconductor chip 1 namely, promotes the complete wetting and coverage of the back of the semiconductor chip 1 with solder 2 or the formation of the soldered seam $2a$ running completely around the semiconductor chip 1.

Instead of the clamp jaws 8, other means can be foreseen in order to lock the gripper 5 onto the bondhead 4. For example, the gripper 5 can be pressed against the bondhead 4 by means of a lever rotatable on an axis and actuated by an electromagnet or can be fixed onto the bondhead 4 by means of vacuum.

Instead of locking the gripper 5 onto the bondhead 4 and raising the bondhead 4 by the distance $H_1$, a solution can be foreseen with which the gripper 5 is raised by the distance $H_1$ in relation to the bondhead 4.

FIG. 4 shows a second embodiment of an apparatus suitable for carrying out the method. With this apparatus, a sensor 11 is present instead of the clamp jaws 8 (FIG. 1A). The sensor 11 comprises a switch formed by means of two electrical contacts. One of the electrical contacts is located in the bondhead 4, the other one on the gripper 5. In the normal condition, ie, when the gripper 5 is not deflected towards the bondhead 4, the contacts touch: The switch is closed. On lowering the bondhead 4 during step c, the switch opens as soon as the gripper 5 is deflected towards the bondhead 4. With suitable electronic means, when raising the bondhead 4 during step d, the point in time $t_c$ is determined at which the switch closes again, the height $H_2$ of the bondhead 4 at this point in time $t_c$ determined and the bondhead raised to the height $H_3 =H_2 +H_1$. The closing of the switch means that the gripper 5 is no longer deflected towards the bondhead 4 and the movement of the bondhead 4 from height $H_2$ to height $H_3 =H_2 +H_1$ follows. The distance $H_1$ corresponds roughly to the desired layer thickness of the solder 2. Hence the gripper 5 covers the distance $H_1$. FIG. 4 shows the apparatus in the condition after the method step d.

In addition, with the sensor 11, it can be checked whether the gripper 5 jams on the bondhead 4. This is the case when both contacts of the sensor 11 remain either always open or always closed.

As described for the first embodiment, an up and down movement of the bondhead 4 with the gripper 5 can also take place here after step d and here also with step e, after releasing the vacuum, either firstly a predetermined period of time can be waited and then the bondhead 4 moved away or the moving away of the bondhead at step f can only take place when the vacuum holding the semiconductor chip 1 falls below a predetermined value. In doing so, the closing of the contacts of the sensor 11 can also be used to trigger the point in time at which the vacuum is to be released.

Figure 5B:
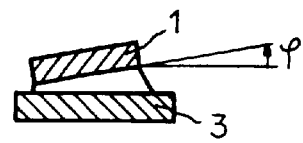

FIG. 5a shows a good quality semiconductor chip 1 mounted by means of the method in accordance with the invention with which the solder has formed good meniscuses 12 and which is aligned parallel to the surface of the substrate the tilt of which is therefore zero. For comparison, FIG. 5b now shows a mounted semiconductor chip 1 of worse quality which is mounted at an angle: The solder layer 2' is of differing thickness, the tilt, presented by means of the angle ($\phi$, is not zero.

FIG. 6 shows a further possibility for the course of the z-height of the semiconductor chip 1 (broken line) and the bondhead 4 (unbroken line) above the support 9 as a function of time t. Here the bondhead is lowered to the height $H_0$, the gripper 5 is clamped immediately on reaching the height $H_0$, ie, around point in time $t_1$ and, as soon as the gripper 5 is secured to the bondhead 4, the bondhead 4 is raised to a height $H_0+H_4$ before the flowing away of the solder 2 out of the gap between the semiconductor chip 1 and the substrate 3 and the jerky sinking of the semiconductor chip 1 can take place. With this process, the solder portion 2 is indeed deformed, but the uncontrolled flowing of the solder 2 out of the gap does not take place. The distance $H_4$ is determined corresponding to the extent of the deflection of the gripper 5 towards the bondhead 4 and the thickness of the solder layer to be achieved.

With certain solder 2—substrate 3 material pairs, it is possible to move the bondhead 4 directly away without the up and down movement. It is then advantageous to already release the vacuum before reaching the height $H_0+H_4$ so that the bondhead 4 can move away without dwelling at height $H_0+H_4$. It is additionally advantageous to control the strength of the vacuum and to provide the gripper 5 with the drill hole 10 serving as a controlled leak so that the period of time c, which stretches from switching off the vacuum up to releasing the semiconductor chip 1 from the gripper 5, is reproducible. Then the vacuum can be released around this period of time X before reaching the height $H_0+H4$ corresponding to the trajectory of the bondhead 4. With this movement also, the semiconductor chip 1 is mechanically guided until reaching the predetermined height $H_0+H_4$.

With other solder 2—substrate 3 material pairs however, it is better to move the bondhead 4 up and down after reaching the height $H_0+H_4$.

The method according to the invention results in excellent solder connections when the semiconductor chip is mounted on a pressed flat solder portion (see EP 852983) the linear dimensions of which are somewhat larger than the linear dimensions of the semiconductor chip. The method in accordance with the invention also results in very good soldered connections when the semiconductor chip is mounted on a drop-shaped solder portion. The various parameters of the method in accordance with the invention enable an optimum adaptation of the movement sequence of the semiconductor chip to the conditions dictated by the solder—substrate material combination. The mechanically controlled movement of the semiconductor chip carried out up to achieving its final position with a stable formed solder layer enables lower process temperatures, i.e., the substrate and the solder must only be heated up to a few ° C. above the melting temperature of the solder. With the previously known methods, process temperatures which lie 50 or 80° C. above the melting temperature of the solder are necessary so that the solder flows back.

We claim:

1. Method for mounting a semiconductor chip on a substrate having a solder portion, the method comprising the following steps:
   a) Presenting the substrate on a support;
   b) Grasping the semiconductor chip by means of a gripper spring mounted on a bondhead;
   c) Lowering the semiconductor chip onto the substrate, whereby the gripper carrying the semiconductor chip is deflected towards the bondhead;
   d) Raising the semiconductor chip by a predetermined distance;
   e) Releasing the semiconductor chip, and
   f) Moving the bondhead away.

2. Method according to claim 1, wherein, with step c, the bondhead is lowered to a predetermined height above the support, that after step c the gripper is secured to the bondhead and that with step d the bondhead is raised by the said distance.

3. Method according to claim 1, wherein, with step c, the bondhead is lowered to a predetermined height above the support, wherein, during step d, a point in time $t_c$ is determined by means of a sensor at which the gripper is no longer deflected towards the bondhead, wherein a height $H_2$ of the bondhead is determined at this point in time $t_c$ and wherein the bondhead is raised to a height $H_3 = H_2 + H_1$, whereby $H_1$ is the said distance.

4. Method according to claim 1, wherein, after step d, the semiconductor chip is moved up and down once or several times in a vertical direction.

5. Method according to claim 2, wherein, after step d, the semiconductor chip is moved up and down once or several times in a vertical direction.

6. Method according to claim 3, wherein, after step d, the semiconductor chip is moved up and down once or several times in a vertical direction.

7. Apparatus for mounting semiconductor chips onto a substrate having a solder portion with a bondhead with a gripper for grasping a semiconductor chip, whereby the gripper is deflectable towards the bondhead and wherein a sensor is present which indicates whether the gripper is deflected.

8. Apparatus according to claim 7, wherein the sensor is a switch formed from two contacts.

* * * * *